United States Patent [19]

Eguchi

[11] Patent Number: 5,195,821
[45] Date of Patent: Mar. 23, 1993

[54] ELECTRONIC-COMPONENT MOUNTING APPARATUS WITH LASER MONITORING DEVICE

[75] Inventor: Shigeru Eguchi, Kasuga, Japan

[73] Assignee: Matsushita Electric Industrial Co., Ltd., Osaka, Japan

[21] Appl. No.: 846,062

[22] Filed: Mar. 5, 1992

[30] Foreign Application Priority Data

Mar. 8, 1991 [JP] Japan .................................. 3-43306

[51] Int. Cl.⁵ ............................................. F21K 7/00
[52] U.S. Cl. ..................................... 362/259; 362/89; 29/834
[58] Field of Search ......................... 362/89, 259, 253; 29/759, 833, 834

[56] References Cited

U.S. PATENT DOCUMENTS

| | | | |
|---|---|---|---|
| 4,959,898 | 10/1990 | Landman et al. | 29/833 X |
| 5,113,565 | 5/1992 | Cipolla et al. | 29/833 X |
| 5,115,559 | 5/1992 | Oyama | 29/833 X |

Primary Examiner—Stephen F. Husar
Attorney, Agent, or Firm—Pollock, VandeSande & Priddy

[57] ABSTRACT

A mounting apparatus for mounting an electronic component on a circuit board, which apparatus has a pickup head with a suction nozzle arranged to be movable on a horizontal plane and further movable vertically with respect to the horizontal plane, thereby picking up and carrying the electronic component to the circuit board. The apparatus is also equipped with a laser monitoring section for monitoring the electronic component picked up by the pickup head. The laser monitoring section includes a laser illuminating device for emitting a laser light beam to the electronic component placed at a monitoring position and for receiving light reflected from the electronic component to obtain information indicative of a state of the electronic component. The laser illuminating device is encased within a cover device arranged to be openable and closable to receive the picked-up electronic component and cover the electronic component when reaching the monitoring position. The cover device has a dome-like configuration and comprises two portions symmetrically arranged to be movable horizontally to be separated from each other and brought close to each other so that the dome-like cover device is openable and closable. This arrangement can prevent the laser light beam from the laser illuminating device from damaging the apparatus operator.

14 Claims, 4 Drawing Sheets

ELECTRONIC-COMPONENT MOUNTING APPARATUS WITH LASER MONITORING DEVICE

BACKGROUND OF THE INVENTION

The present invention relates generally to a mounting apparatus for mounting electronic components on a circuit board, amd more particularly to such an electronic-component mounting apparatus equipped with a laser monitoring device to monitor a lifting (floating) state of a lead wire of the electronic component such as an IC chip and an LSI chip.

Generally, electronic-component mounting apparatus are arranged such that an electronic component accommodated in a feeding section such as a tray is sucked and picked up by a suction nozzle of a picking and mounting head and then mounted on a circuit board positioned at a predetermined place by a positioning device after correction of positional divergences (slippages) of the picked-up electronic component in directions X and Y perpendicular to each other on a horizontal plane and in a direction θ of rotation about the axis of the electronic component itself. For mounting the electronic component onto the circuit board, the correction of the positional divergences of the electronic component allows accurate positioning of lead wires of the electronic component with respect to electrodes of the circuit board. Recently, the electronic-component mounting apparatus is additionally required to have a function to finely monitor undersirable states, such as lifting, of the lead wires of the electronic component mounted on the circuit board. Accordingly, an electronic-component mounting apparatus has been proposed which is equipped with a laser type monitoring device to monitor the lifting state of the lead wires of the electronic component with laser light. There is a problem which arises with such a laser type monitoring device, however, in that there is the possibility that the operator (operating person) is illuminated with the laser light in error. Thus, a further improvement would be required from the viewpoint of safety for the operator.

SUMMARY OF THE INVENTION

It is therefore an object of the present invention to provide an electronic-component mounting apparatus equipped with a laser type monitoring device which is capable of safely mounting electronic components on a circuit board without laser light exposure to the operator.

With this object and other features which will become apparent as the description proceeds, an electronic-component mounting apparatus basically comprises pickup head means arranged to be movable on a horizontal plane and further movable vertically with respect to the horizontal plane, the pickup head means being equipped with a suction nozzle coupled to a suction device so as to suck and pick up the electronic component, and laser monitoring means for monitoring the electronic component picked up and carried up to a monitoring position by the pickup head means. The laser monitoring means includes laser illuminating means for emitting a laser light beam to the electronic component placed at the monitoring position and for receiving light reflected from the electronic component to obtain information indicative of a state of the electronic component; and cover means arranged to be openable and closable to receive the electronic component picked up by the pickup head means and cover the electronic component when reaching the monitoring position. More specifically, the cover means has a dome-like configuration and comprises two portions symmetrically arranged to be movable horizontally to be separated from each other and brought close to each other so that the dome-like cover means is openable and closable. Further, the two portions of the dome-like cover device have substantially semicircular concaves coupled to each other so as to form an opening at a top portion of the cover means when the two portions are brought close to each other, the opening having a diameter substantially equal to the outer diameter of the suction nozzle of the pickup head means so that the two portions of the dome-like cover means are closable with the suction nozzle being interposed therebetween.

Preferably, the laser illuminating means is placed on horizontally movable table means, driven by drive means, so as to be movable on a horizontal plane in accordance with the horizontal movement of the table means, and includes one light-emitting portion for emitting the laser light beam to the electronic component and two light-receiving portions for receiving the reflection light from the electronic component, the two light-receiving portions being symmetrically disposed with respect to the light-emitting portion. Further, the pickup head means is equipped with rotatable drive means and the suction nozzle is coaxially coupled to a rotating shaft of the rotatable drive means so as to be rotatable about its own axis in accordance with rotation of the rotating shaft.

According to this invention, there is further provided an electronic-component mounting apparatus equipped with cover means comprising a substantially cylindrical case for accommodating the laser illuminating means and a circular cover for covering an upper opening formed an upper portion of the cylindrical case, the circular cover being coaxially fixed to the suction nozzle of the pickup head means so that the circular cover completely covers the upper opening of the cylindrical case when the electronic component held by the suction nozzle reaches the monitoring position within the cylindrical case. Preferably, the cylindrical case has at the upper portion sensor means for detecting the fact that the circular cover completely covers the opening of said cylindrical case.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
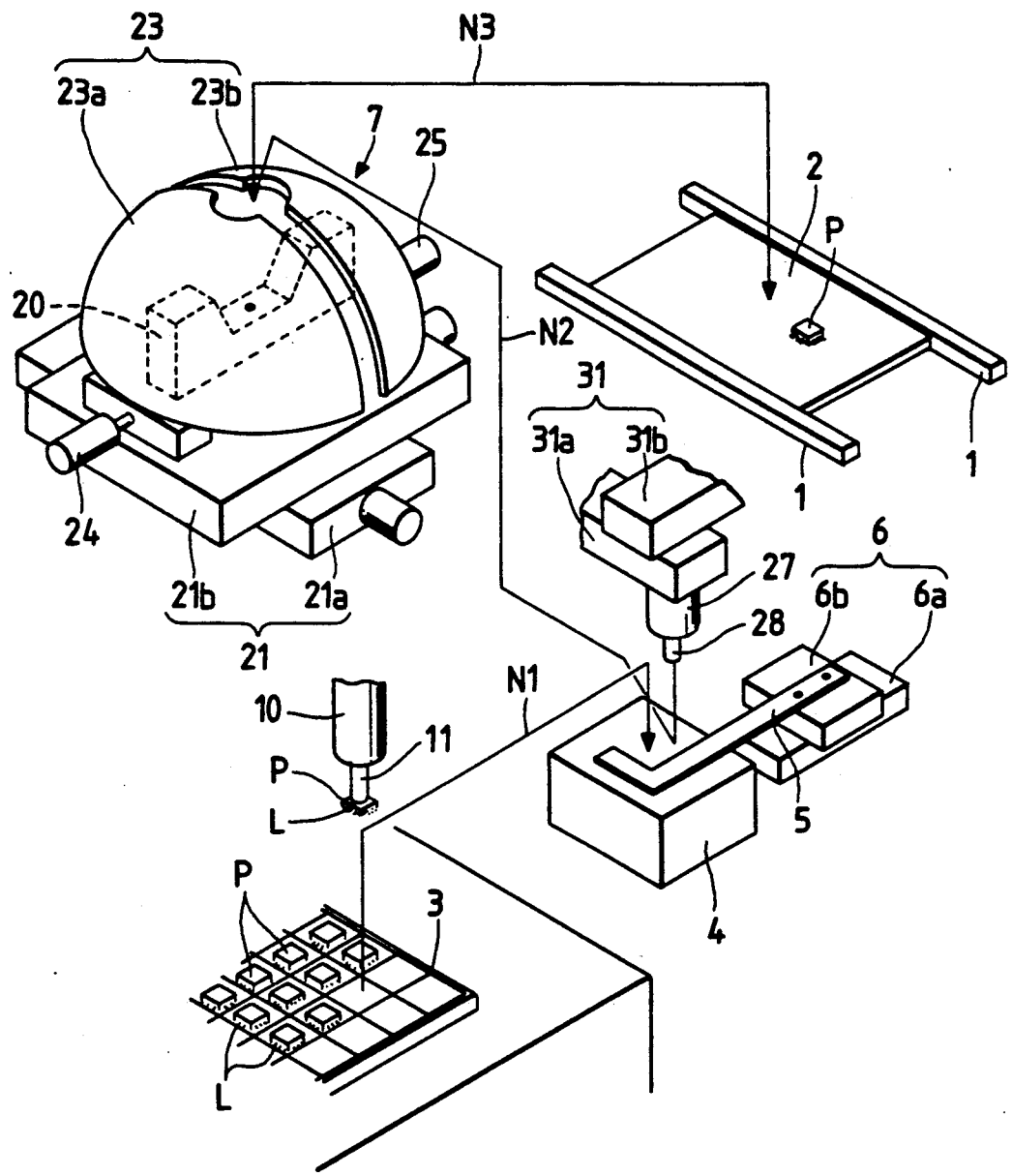
FIG. 1 is a perspective view showing an arrangement of an electronic-component mounting apparatus according to a first embodiment of the present invention.

Referring now to FIG. 1, there is illustrated an arrangement of an electronic-component mounting apparatus according to a first embodiment of the present invention. In FIG. 1, designated at numeral 1 is a board-positioning section comprising a pair of clamping members connected to a conveyer belt, not shown, so as to clamp and position an circuit board 2 supplied through the conveyer belt, and denoted at numeral 3 is an electronic-component feeding section such as a tray encasing a plurality of electronic components P each having a number of lead wires L at its sides. With respect to the feeding section 3 there is disposed a first electronic-component pickup head 10 fixedly attached to a lower surface of a horizontally movable table, not shown, positioned above a base of the electronic-component mounting apparatus, whereby the first pickup head 10 is movable on a horizontal plane in accordance with the movement of the horizontally movable table. In addition, the first pickup head 10 is attached to a vertically movable device secured to the horizontally movable table, whereby the first pickup head 10 is further movable in directions perpendicular to the lower surface of the horizontally movable table. The first pickup head 10 is at its lower end portion equipped with a suction nozzle 11 coupled through a suction passage to a suction device, not shown. Thus, the first pickup head 10 can moves toward the target electronic component P within the feeding section 3 by means of the horizontally movable table and the vertically movable device, and the suction nozzle 11 can suck and pick up the electronic component P by means of the suction device.

Figure 2:
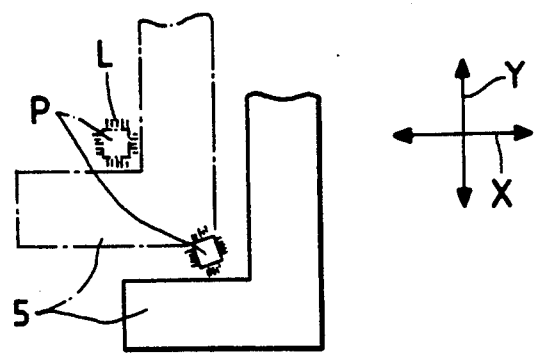
FIG. 2. is an illustration for describing the function of a position-regulating member to be used in the FIG. 1 apparatus.

After the picking-up of the electronic component P, the first pickup head 10 carries the electronic component P up to a rough-correction stage 4 as indicated by an arrow N1 in FIG. 1 so as to once place it thereon. On the rough-correction stage 4 there is disposed a position-regulating member 5 having two elongated portions normal to each other on a horizontal plane. The position-regulating member 5 is at its one end portion held by a first X-Y table assembly 6 arranged to be movable on a horizontal plane. More specifically, the first X-Y table assembly 6 is composed of an X table 6a movable in directions X on the horizontal plane and a Y table 6b movable in directions normal to the directions X on the same horizontal plane, the X table 6a and Y table 6b being driven by drive devices such as electric motors (not shown), respectively. As illustrated in FIG. 2, with the position-regulating member 5 being moved in the directions X and Y on the rough-correction stage 4 by means of the first X-Y table assembly 6, the inner part of the normal portion of the position-regulating member 5 comes into contact with the distal portions of the lead wires L of the picked-up electronic component P so that the electronic component P is positioned to cause the distal portions thereof are substantially aligned with the inner part of normal portion thereof. This permits the rough correction of the positional divergences of the electronic component P. Here, the rough correction can also be achieved with the rough-correction stage 4 being moved relatively in the directions X and Y with respect to the position-regulating member 5 fixed.

Figure 3:
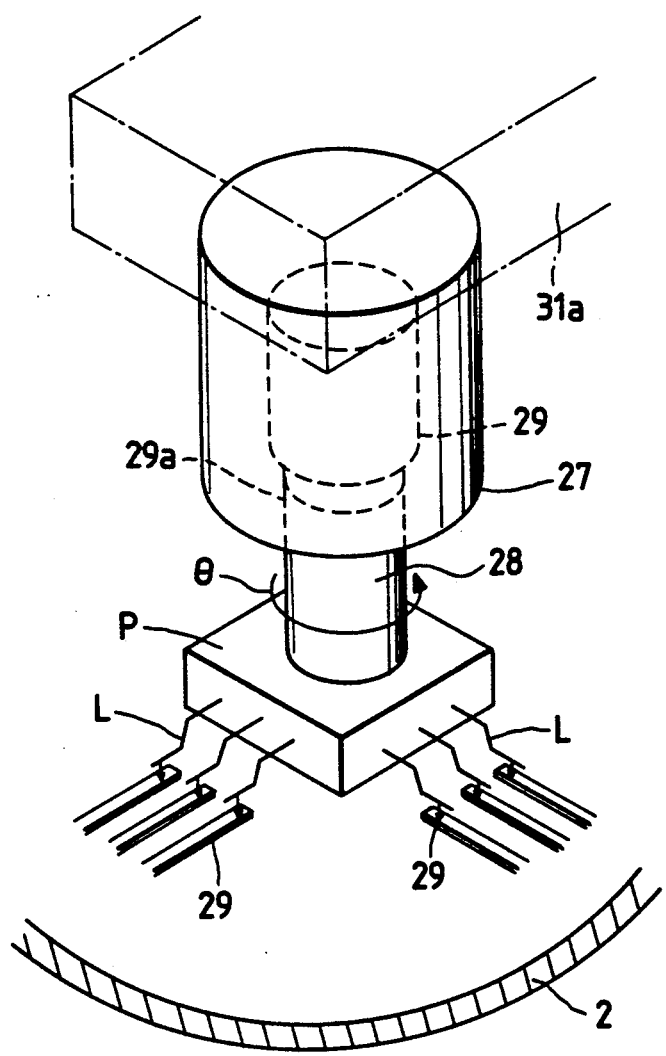
FIG. 3 is a perspective view showing an arrangement of an electronic-component pickup head to be used in the FIG. 1 apparatus.

Returning again to FIG. 1, a second electronic-component pickup head 27 having a substantially cylindrical configuration is fixedly secured to a second X-Y table assembly 31 comprising X and Y tables 31a and 31b arranged to be three-dimensionally movable in predetermined directions X and Y on a horizontal plane and movable vertically as well as the X and Y tables 6a and 6b of the first X-Y table assembly 6. The second pickup head 27 is also provided with a suction nozzle 28 having a cylindrical configuration and a substantially similar structure to the suction nozzle 11 of the first pickup head 10, and further provided with an electric motor 29 whose rotating shaft 29a is coaxially coupled to the suction nozzle 28, as shown in FIG. 3. That is, the suction nozzle 28 of the second pickup head 27 is arranged to be rotatable about its own axis in a direction indicated by an arrow $\theta$ in FIG. 3 in accordance with the rotation of the rotating shaft 29a of the electric motor 29.

Figure 4:
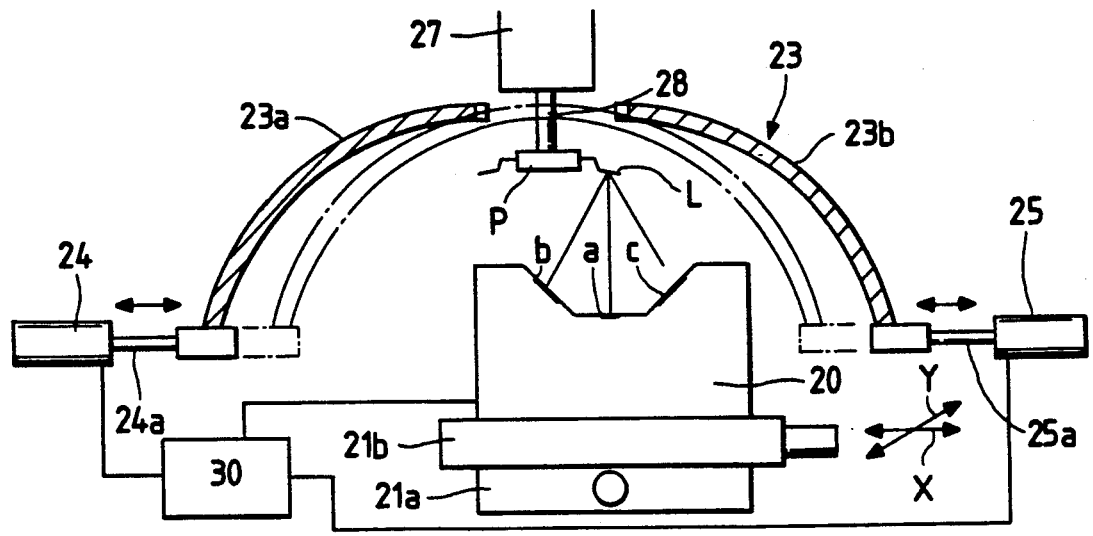
FIG. 4 is a cross-sectional view showing an arrangement of an electronic-component monitoring section of the FIG. 1 apparatus.

In FIG. 1, after the rough positional correction, the suction nozzle 28 of the second pickup head 27 approaches the electronic component P on the rough-correction stage 4 so as to suck and pick up the electronic component P, before directing toward a laser monitoring section 7 as indicated by an arrow N2 in order to monitor or measure the lead wires L of the electronic component P. The laser monitoring section 7 is held on a third X-Y table assembly 21 comprising X and Y tables 21a and 21b arranged to be movable in predetermined directions X and Y on a horizontal plane as well as the X and Y tables 6a and 6b of the first X-Y table assembly 6. The laser monitoring section 7 includes a laser illuminating device 20 encased in a cover device 23. The laser illuminating device 20 substantially has a rectangular configuration and has a concave at its central portion. As illustrated in FIG. 4, at the bottom portion of the concave there is formed a light emitting section a and at the both side portions there are symmetrically disposed light receiving section b and c. A laser light beam emitted from the light emitting section a is directed to the electronic component P picked up and carried by the suction nozzle 28 of the second pickup head 27. The reflection light from the electronic component P is received by the symmetrically disposed light receiving sections b and c, thereby measuring the positional divergences and lifting of the lead wires L of the electronic component P. Here, since the positional divergences of the lead wires L of the electronic component P roughly corrected by the position-regulating member 5 on the rough-correction stage 4, it becomes possible that the laser light beam from the light emitting section a accurately hits the lead wires L of the electronic component P.

The cover device 23 has a semi-spherical and dome-shaped configuration and comprises two covers 23a and 23b provided symmetrically and movable relatively to be opened. The cover device 23 is arranged to have at its top portion an opening having a diameter substantially equal to the diameter of the suction nozzle 28 of the second pickup head 27 in the state that the cover device 23 is closed, that is, in the case that the two covers 23a and 23b come into contact with each other. With this arrangement, the cover device 23 can put the substantially central portion of the suction nozzle 28 in the opening so as to cover the electronic component P sucked to the distal portion of the suction nozzle 28 so as to prevent the laser light emitted from the light emitting section a of the laser illuminating section 20 from being leaked out. The inner surface of the cover device 23 is coated with a black-color paint or alumite-machined to thereby absorb unnecessary light.

Furthermore, in FIG. 4, the cover device 23 includes a control unit 30 for controlling the movements (opening and closing operations) of the two covers 23a and 23b. That is, the control unit 30 gives control signals to cylinder drive units 24 and 25, which in turns operate in response to the control signals therefrom so as to drive reciprocating rods 24a and 25a one end portion of which are respectively accommodated in cylinders of the drive units 24 and 25 and the other end portions of which is connected to lower portions of the covers 23a and 23b. The control unit 30 also includes a comparison and decision device, not shown, which is responsive to output signals (corresponding to the reflection light information) of the light-receiving portions b and c of the light illuminating device 20 so as to compare them with predetermined reference data to decide the positional divergences of the electronic component P sucked by the suction nozzle 28 of the second pickup head 27.

Secondly a description will be made hereinbelow in terms of the operation of the electronic-component mounting apparatus arranged as described above. In FIG. 1, the first pickup head 10 moves along a path indicated by the arrow N1 after picking up the electronic component P from the feeding section 3 so as to place the picked-up electronic component P on the rough-correction stage 4. The position-regulating member 5 shifts the electronic component P in the directions X and Y on the rough-regulating stage 4 as illustrated in FIG. 2 so as to push the electronic component P to thereby correct the positional divergences of the electronic component P in the directions X, Y and $\theta$. Thereafter, the second pickup head 27 picks up the electronic component P on the rough-correction stage 4 and then carries it toward a position above the laser monitoring section 7 along a path indicated by the allow N2. At this time, the cover device 23 comprising the two covers 23a and 23b is in the opening state by means of the cylinder drive devices 24 and 25. In this state, as illustrated in FIG. 4, the suction nozzle 28 of the second pickup head 27 moves downwardly into the inside of the cover device 23 and then stops at an adequate position. At the same time, the cover device 23 starts to take the closed state with the control unit 30 operating the cylinder drive devices 24 and 25, thereby completely covering the electronic component P sucked by the suction nozzle 28 of the second pickup head 27. Further, the light-emitting portion a of the laser illuminating device 20 of the laser monitoring section 7 emits a laser light beam toward the lead wires L of the electronic component P so as to produce the reflection light from the lead wires thereof which is in turn received by means of the light-receiving portions b and c of the laser illuminating device 20. The light-receiving portions b and c of the laser illuminating device 20 generate signals indicative of the information of the reflected light from the lead wires L of the electronic component P. In response to the signals from the light-receiving portions b and c thereof, the comparison and decision device of the control unit 30 decides (measures) the positional divergences of the lead wires L of the electronic component P in the directions X, Y and $\theta$ and further measures the lifting state of the lead wires L thereof. Here, since the cover device 23 completely covers the electronic component P from the upper side, the laser light emitted from the lower side can be prevented from being leaked toward the outside of the cover device 23. The control unit 30 controls the laser illuminating device 20 so that the laser light beam is emitted only in the case that the cover device 23 is in the closed state.

After the measurement of the positional divergences and the lifting state of the lead wires L of the electronic component P, the cover device 23 takes the opening state and the second pickup head 27 moves along a path indicated by an arrow N3 in FIG. 1 so as to direct toward a position above the circuit board 2. When reaching the position above the circuit board 2, the second pickup head 27 moves downwardly in order to mount the electronic component P on the circuit board 2. When the control unit 30 has detected the positional divergences of the lead wires L of the electronic component P, during the movement of the second pickup head 27 to the circuit board 2, a X-Y table control unit (not shown) (or the control unit 30) controls the X and Y tables 31a and 31b of the second X-Y table assembly 31 to correct the positional divergences of the electronic component P in the directions X and Y and a head control unit (not shown) (or the control unit 30) controls the electric motor 29 to correct the positional divergence of the electronic component P in the direction $\theta$. On the other hand, when the control unit 30 has detected the abnormality (lifting) of the lead wires L of the picked-up electronic component P, the second pickup head 27 carriers the electronic component P along a different path, not shown, without moving toward the circuit board 2, thereby removing it.

Figure 5:
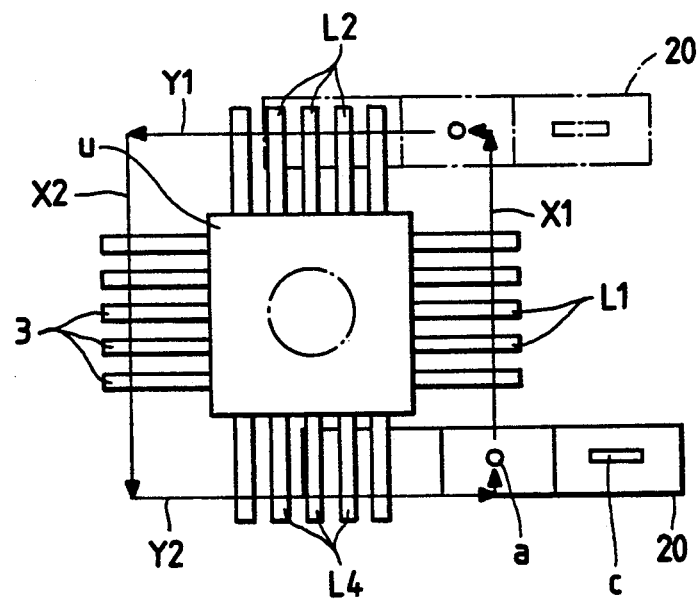
FIG. 5 is an illustration for describing a method of scanning lead wires of an electronic component with a laser light beam.

Moreover, a description will be made hereinbelow with reference to FIG. 5 in terms of a method of effectively measuring the lifting state and the positional divergences of the lead wires L of the electronic component P. In FIG. 5, the laser monitoring section 7 is first moved under the lead wires L1 of the lead wires L extending from the four sides of the electronic component P and the third X-Y table assembly 21 is then moved so that the laser illuminating device 20 moves in a direction indicated by an arrow X1 so as to scan the lead wires L1 in a direction perpendicular to the lead-wire L1 extending directions on a horizontal plane with the laser light beam emitted from the light-emitting portion a. The reflection light from the lead wires L1 is received by the light-receiving portions b and c to thereby measure the positional divergences of the lead wires L1 in the directions X, Y and $\theta$ and further measure the lifting thereof. After the completion of the scanning operation for the lead wires L1 extending from one side of the electronic component P, the laser illuminating device 20 is moved in a direction indicated by an arrow Y1 so as to scan the lead wires L2 extending from the next side to measure the positional divergences and the lifting of the lead wires L2. Similarly, the laser illuminating device 20 is moved in a direction as indicated by an arrow X2 to monitor the lead wires L3 and further moved in a direction indicated by an arrow Y2 to check the lead wires L4. With the lead wires L1 to L4 extending from the four sides of the electronic component P being successively scanned in the directions X1, Y1, X2 and Y2, it is possible to speedily measure all the lead wires L of the electronic component P.

In addition, the mounting apparatus according to this embodiment is arranged to check the positional divergences and lifting of the lead wires L on the basis of the signal from one of the two light-receiving portions b and c on which a larger quantity of the reflection light from the lead wires L is incident or on the basis of the average value of the values of the output signals of the two light-receiving portions b and c. That is, the provision of the two light-receiving portions b and c allows more accurate measurement as compared with the case of the provision of a single light-receiving portion. In addition, for checking the presence or absence of the lead wires L, it is possible to easily decide that the lead wires L exist on the electronic component P, when at least one of the two light-receiving portions b and c receives the reflection light therefrom.

Figure 6:
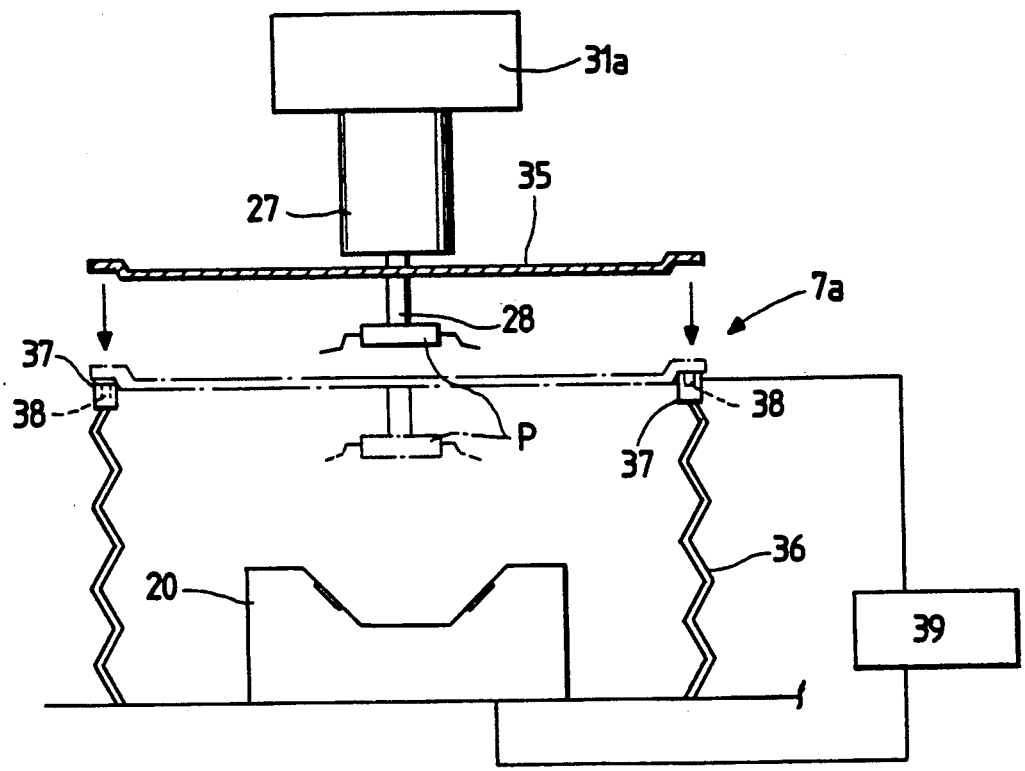
FIGS. 6 and 7 are cross-sectional views showing an electronic-component monitoring section of a mounting apparatus according to a second embodiment of this invention.

Further, a second embodiment of this invention will be described hereinbelow with reference to FIG. 6 where parts corresponding to those in FIGS. 1 to 5 are indicated with the same marks and the description thereof will be omitted for brevity. One difference between the above-described first embodiment and this second embodiment is the arrangement of the laser monitoring section for measuring the positional divergences and lifting state of the electronic component P. That is, in FIG. 6, designated at reference 7a is a laser monitoring section corresponding to the laser monitoring section 7 in the first embodiment, the laser monitoring section 7a including a cover (cap) 35 having a disc-like configuration. The cover device 35 is attached to a portion of a suction nozzle 28 of a second pickup head 27 so that its surfaces are arranged to be substantially parallel to the lower surface of the suction nozzle 28. The laser monitoring section 7a is further equipped with a bellows-like flexible case 36 substantially having a cylindrical configuration to surround a laser illuminating device 20 placed on a base of the eletronic-component mounting apparatus. At the upper portion (opening portion) of the flexible case 36 there is provided a ring-like member 37 encasing a sensor 38. The ring-like member 37 is disposed so that its upper surface becomes parellel to the surface of the cover device 35. The cover device 35 is movable downwardly together with the downward movement of the second pickup head 27 so as to cover the opening portion of the flexible case 36 to prevent the laser light emitted from the laser illuminating device 20 from being leaked out. At this time, the sensor 38 of the ring-like member 37 senses the fact that the cover device 35 entirely comes into contact with the upper surface of the ring-like member 37, in other words, that the cover device 35 completely covers the flexible case 36. A control unit 39 is responsive to the output signal of the sensor 38 so that the laser illuminating device 20 is operable only when the sensor 38 detects the fact that the cover device 35 completely covers the flexible case 36.

Figure 7:
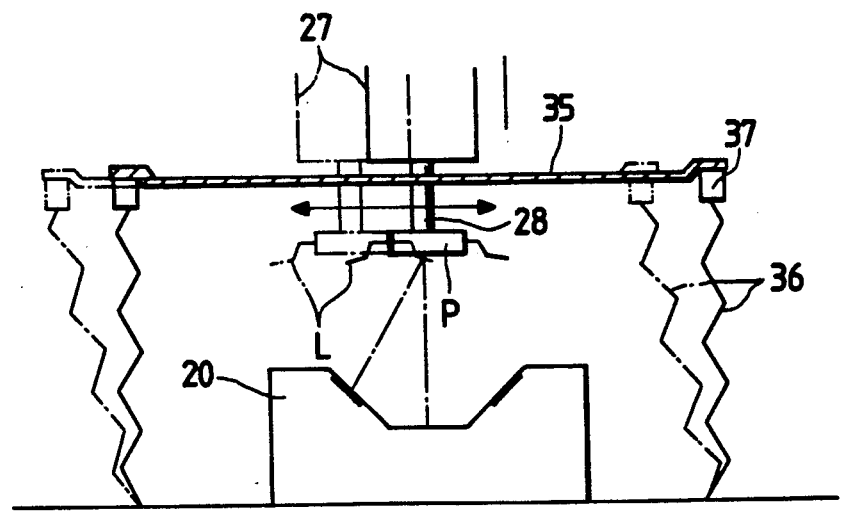

In operation, the second pickup head 27 sucks and pickup the electronic component P by means of the suction nozzle 28 before moving toward a position above the flexible case 36. After reaching the position above the flexible case 36, the second pickup head 27 moves downwardly so that the cover device 35 fixedly secured to the portion of the suction nozzle 28 comes into contact with the ring-like member 37 provided at the top portion of the flexible case 36 to thereby completely cover the flexible case 36 (or the electronic component P picked up). This fact is detected by the sensor 38 and hence the laser illuminating device 20 emits a laser light beam toward the lead wires L of the electronic component P. Secondly, as illustrated in FIG. 7, the second pickup head 7 horizontally moves in directions X and Y with the flexible case 36 being horizontally bent, thereby successively scanning the lead wires L with the laser light beam from the laser iluminating device 20. In response to the completion of the measurement of the lead wires L of the electronic component P, the laser illuminating device 20 stops to emit the laser light beam to the lead wire L. Here, it is also appropriate that the laser illuminating device 20 is fixedly secured onto an X-Y table assembly so as to be movable in the directions X and Y without moving the second pickup head 27.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. A mounting apparatus for mounting an electronic component on a circuit board, said mounting apparatus comprising:

pickup head means arranged to be movable vertically, said pickup head means being equipped with a suction nozzle coupled to a suction device so as to suck and pick up said electronic component; and laser monitoring means for monitoring said electronic component picked up and carried up to a monitoring position by said pickup head means, said laser monitoring means including:

laser illuminating means for emitting a laser light beam to said electronic component placed at said monitoring position and for receiving light reflected from said electronic component to obtain information indicative of a state of said electronic component; and cover means arranged to be openable and closable to cover said electronic component picked up by said pickup head means when said electronic component reaches said monitoring position.

2. A mounting apparatus as claimed in claim 1, wherein said laser illuminating means is placed on horizontally movable table means, driven by drive means, so as to be movable on a horizontal plane in accordance with the horizontal movement of said table means.

3. A mounting apparatus as claimed in claim 1, wherein said laser illuminating means includes one light-emitting portion for emitting said laser light beam to said electronic component and two light-receiving portions for receiving the reflection light from said electronic component, said two light-receiving portions being symmetrically disposed with respect to said light-emitting portion.

4. A mounting apparatus as claimed in claim 1, wherein said pickup head means is equipped with rotatable drive means and said suction nozzle is coaxially coupled to a rotating shaft of said rotatable drive means so as to be rotatable about its own axis in accordance with rotation of said rotating shaft.

5. A mounting apparatus as claimed in claim 1, wherein said cover means has a dome-like configuration and comprises two portions symmetrically arranged to be movable horizontally to be separated from each other and brought close to each other so that said dome-like cover means is openable and closable.

6. A mounting apparatus as claimed in claim 1, wherein said laser illuminating means emits said laser light beam only when said cover means is in the closed state.

7. A mounting apparatus as claimed in claim 5, wherein said two portions of said dome-like cover device have substantially semicircular concaves coupled to each other so as to form an opening at a top portion of said cover means when said two portions are brought close to each other, said opening having a diameter substantially equal to the outer diameter of said suction nozzle of said pickup head means so that said two portions of said dome-like cover means are closable with said suction nozzle being interposed therebetween.

8. A mounting apparatus as claimed in claim 1, wherein said pickup head means is arranged to be movable on a horizontal plane and further movable vertically with respect to said horizontal plane.

9. A mounting apparatus for mounting an electronic component on a circuit board, said mounting apparatus comprising:
pickup head means arranged to be movable vertically, said pickup head means being equipped with a suction nozzle coupled to a suction device so as to suck and pick up said electronic component; and
laser monitoring means for monitoring said electronic component picked up and carried up to a monitoring position by said pickup head means, said laser monitoring means including:
laser illuminating means for emitting a laser light beam to said electronic componment placed at said monitoring position and for receiving light reflected from said electronic component to obtain information indicative of a state of said electronic component; and
cover means comprising a case for accommodating said laser formed an upper portion of said case, said cover being fixed to said suction nozzle of the pickup head means so that said cover completely covers said upper opening of said case when said electronic component held by said suction nozzle reaches said monitoring position.

10. A mounting apparatus as claimed in claim 9, said cylindrical case is flexible and has at said upper portion sensor means for detecting the fact that said circular cover completely covers said opening of said cylindrical case.

11. A mounting apparatus as claimed in claim 9, wherein said laser illuminating means is placed on horizontally movable table means, driven by drive means, so as to be movable on a horizontal plane in accordance with the horizontal movement of said table means.

12. A mounting apparatus as claimed in claim 9, wherein said laser illuminating means includes one light-emitting portion for emitting said laser light beam to said electronic component and two light-receiving portions for receiving the reflection light from said electronic component, said two light-receiving portions beng symmetrically disposed with respect to said light-emitting portion.

13. A mounting apparatus as claimed in claim 9, wherein said pickup head means is equipped with rotatable drive means and said suction nozzle is coaxially coupled to a rotating shaft of said rotatable drive means so as to be rotatable about its own axis in accordance with rotation of said rotating shaft.

14. A mounting apparatus as claimed in claim 9, wherein said pickup head means is arranged to be movable on a horizontal plane and further movable vertically with respect to said horizontal plane.

* * * * *